US012679722B2

(12) United States Patent
Xia et al.

(10) Patent No.: US 12,679,722 B2
(45) Date of Patent: Jul. 14, 2026

(54) MICRO-ELECTRO-MECHANICAL SYSTEM PACKAGE AND FABRICATION METHOD THEREOF

(71) Applicant: Vanguard International Semiconductor Corporation, Hsinchu (TW)

(72) Inventors: Jia Jie Xia, Singapore (SG); Guofu Zhou, Singapore (SG)

(73) Assignee: Vanguard International Semiconductor Corporation, Hsinchu (TW)

( * ) Notice: Subject to any disclaimer, the term of this patent is extended or adjusted under 35 U.S.C. 154(b) by 384 days.

(21) Appl. No.: 18/219,055

(22) Filed: Jul. 6, 2023

(65) Prior Publication Data

US 2025/0011165 A1     Jan. 9, 2025

(51) Int. Cl.
B81B 7/00 (2006.01)
B81C 1/00 (2006.01)

(52) U.S. Cl.
CPC ........ B81C 1/00269 (2013.01); B81B 7/0032 (2013.01); *B81B 2203/0315* (2013.01); *B81B 2203/033* (2013.01); *B81B 2203/0353* (2013.01); *B81B 2207/097* (2013.01); *B81C 2201/0132* (2013.01); *B81C 2201/0147* (2013.01); *B81C 2201/0156* (2013.01); *B81C 2201/0174* (2013.01)

(58) Field of Classification Search
CPC . B81B 7/0032; B81B 7/02; B81B 2203/0315; B81B 2203/033; B81B 2203/0353; B81B 2207/097; B81B 2201/0235; B81B 2201/0242; B81C 1/00269; B81C 2201/0132; B81C 2201/0147; B81C 2201/0156; B81C 2201/0174; B81C 2203/0109; B81C 2203/0145
See application file for complete search history.

(56) References Cited

U.S. PATENT DOCUMENTS

| | | | |
|---|---|---|---|
| 9,567,210 B2 | 2/2017 | Cheng | |
| 9,725,305 B2 | 8/2017 | Shin | |
| 2016/0137492 A1* | 5/2016 | Cheng | B81B 7/007 |
| | | | 438/51 |
| 2016/0244325 A1* | 8/2016 | Cheng | B81C 1/00293 |
| 2023/0045257 A1* | 2/2023 | Lee | B81B 7/007 |

* cited by examiner

*Primary Examiner* — Moazzam Hossain
(74) *Attorney, Agent, or Firm* — Winston Hsu

(57) ABSTRACT

A micro-electro-mechanical system (MEMS) package includes a wafer with an interconnect layer disposed thereon. A first device substrate including a first MEMS device and a second device substrate including a second MEMS device are laterally spaced apart from each other and disposed on the wafer. A first and a second bond seal rings are disposed below the first and the second device substrates, respectively, and both bonded to the interconnect layer. A first handle substrate includes a first cavity having a first pressure, and is bonded to the first device substrate. A second handle substrates includes a second cavity having a second pressure different from the first pressure, and is bonded to the second device substrate. A hole is disposed in the second bond seal ring for pressure adjustment in the second cavity.

11 Claims, 10 Drawing Sheets

MICRO-ELECTRO-MECHANICAL SYSTEM PACKAGE AND FABRICATION METHOD THEREOF

BACKGROUND OF THE INVENTION

1. Field of the Invention

The present disclosure relates generally to micro-electro-mechanical system (MEMS) packages, and more particularly to MEMS packages including MEMS devices with different pressures, and fabrication methods thereof.

2. Description of the Prior Art

Micro-electro-mechanical system (MEMS) devices are microscopic devices that integrate mechanical and electrical components to sense physical quantities and/or to interact with the surrounding environment. MEMS devices, such as accelerometers, gyroscopes, pressure sensors and microphones, have found widespread use in many modern electronic products. For example, inertial measurement units (IMU) composed of accelerometers and/or gyroscopes are commonly found in tablet computers, automobiles, or smartphones. For some applications, various MEMS devices need to be integrated into one MEMS package. However, for MEMS devices requiring different pressures, these MEMS devices need to be packaged separately at different ambient pressure and then integrated into one MEMS package. Therefore, the whole packaging process of the conventional MEMS packages is complicated and the conventional MEMS packages have large footprint.

SUMMARY OF THE INVENTION

In view of this, embodiments of the present disclosure provide micro-electro-mechanical system (MEMS) packages and fabrication methods thereof to overcome the aforementioned drawbacks of the conventional MEMS packages. The MEMS packages of the present disclosure include a hole in a bond seal ring to achieve pressure adjustment in a cavity for a MEMS device after bonding. Moreover, an anti-stiction coating layer may be formed on the MEMS device during the process step of pressure adjustment. Therefore, the whole packaging process of the MEMS package including multiple MEMS devices with different cavity pressures is simplified and the footprint of the MEMS package is small compared with those of the conventional MEMS packages.

According to one embodiment of the present disclosure, a micro-electro-mechanical system (MEMS) package is provided and includes a wafer, an interconnect layer, a first device substrate, a second device substrate, a first bond seal ring, a second bond seal ring, a first handle substrate, a second handle substrate, a hole, and a dielectric film. The interconnect layer is disposed on the wafer. The first device substrate includes a first MEMS device and is disposed on the wafer. The second device substrate includes a second MEMS device and is also disposed on the wafer to be laterally spaced apart from the first device substrate. The first bond seal ring is disposed below the first device substrate and bonded to the interconnect layer. The second bond seal ring is disposed below the second device substrate and also bonded to the interconnect layer. The first handle substrate includes a first cavity and is bonded to the first device substrate. The second handle substrate includes a second cavity and is bonded to the second device substrate.

The hole is disposed in the second bond seal ring. In addition, the dielectric film is disposed on the interconnect layer and adjacent to both the first bond seal ring and the second bond seal ring. The first cavity has a first pressure, and the second cavity has a second pressure different from the first pressure.

According to one embodiment of the present disclosure, a method of fabricating a MEMS package is provided and includes the following steps. A handle wafer is provided and includes a first cavity and a second cavity formed therein. A device wafer is provided and includes a first MEMS device and a second MEMS device formed therein and laterally spaced apart from each other. A first bond seal ring and a second bond seal ring are formed below the first MEMS device and a second MEMS device, respectively. A hole is formed in the second bond seal ring. Two pre-cut lines are formed in the device wafer and between the first MEMS device and the second MEMS device. The handle wafer is bonded to the device wafer, where the first cavity is directly above the first MEMS device, and the second cavity is directly above the second MEMS device. A wafer is provided and an interconnect layer is formed on the wafer. The device wafer is bonded to the interconnect layer on the wafer at a first pressure. A portion of the handle wafer and a portion of the device wafer between the two pre-cut lines are removed to expose the hole in the second bond seal ring at an ambient pressure. In addition, a dielectric film is formed on the interconnect layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
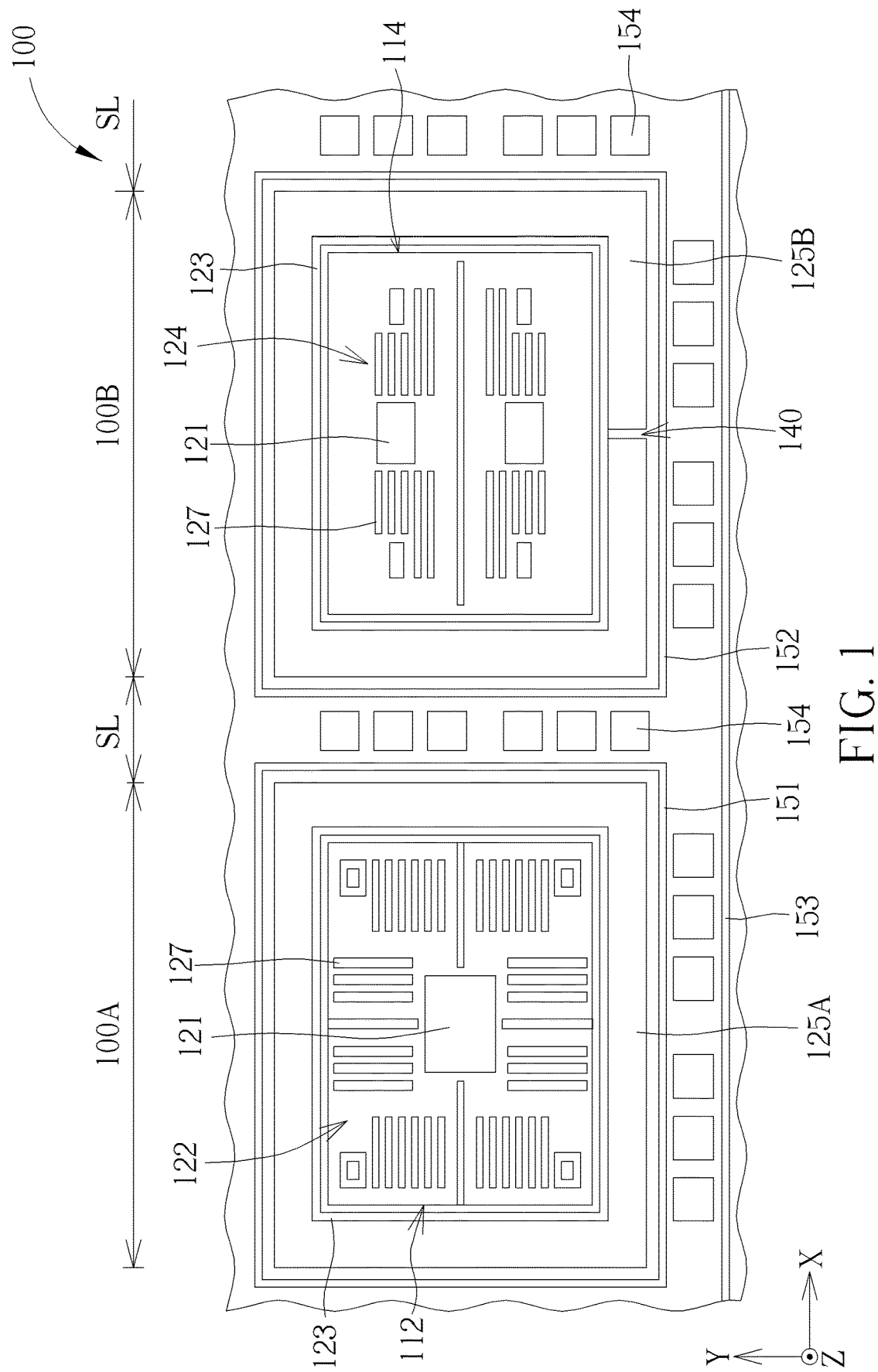
FIG. 1 is a schematic top view of a MEMS package according to one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "under", "on", "over", "above", "upper", "bottom", "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "under" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first", "second", and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that may vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to MEMS packages and fabrication methods thereof. The MEMS package includes a first MEMS device packaged at a first pressure and a second MEMS device packaged at a second pressure different from the first pressure. In some embodiments, the MEMS package may include an inertial measurement unit (IMU) including an accelerometer and a gyroscope, and other MEMS devices requiring different pressures. In some embodiments, the first MEMS device may be a gyroscope requiring the first pressure of a high vacuum, and the second MEMS device may be an accelerometer requiring the second pressure of a low vacuum. A first and a second bond seal rings are disposed corresponding to the first and the second MEMS devices, respectively. A hole is disposed in the second bond seal ring to form a vent hole, thereby achieving post bonding pressure adjustment in a second cavity for the second MEMS device. In addition, an anti-stiction coating layer may be formed on the second MEMS device through the vent hole during the process step of post bonding pressure adjustment. Therefore, the whole packaging process of the MEMS package including various MEMS devices with different cavity pressures is simplified and the footprint of the MEMS package is smaller than those of the conventional MEMS packages.

FIG. 1 is a schematic top view of a MEMS package 100 according to one embodiment of the present disclosure. The MEMS package 100 includes various MEMS devices separated from each other. For example, a first MEMS device 122 is located in a first MEMS region 100A and a second MEMS device 124 is located in a second MEMS region 100B, where the first MEMS region 100A and the second MEMS region 100B are separated by a scribe line SL. There are two pre-cut lines 151 and 152 formed in the scribe line SL and between the first MEMS device 122 and the second MEMS device 124. In addition, multiple bond pads 154 are disposed in the scribe line SL and between the two pre-cut lines 151 and 152. Another pre-cut line 153 is also formed in the scribe line SL. The operations of the first MEMS device 122 and the second MEMS device 124 require different vacuum levels, and the MEMS structures of the first MEMS device 122 and the second MEMS device 124 are different from each other. Each of the first MEMS device 122 and the second MEMS device 124 may include features such as standoff bumps 121, trenches 127, proof masses (not shown), etc., and the layout of the standoff bumps 121, the trenches 127 and other features in the first MEMS device 122 is different from the layout of those features in the second MEMS device 124. In some embodiments, the first MEMS device 122 may be a gyroscope requiring high vacuum, and the second MEMS device 124 may be an accelerometer requiring low vacuum or atmospheric pressure. Moreover, the second MEMS device 124 may need an anti-stiction coating, and the first MEMS device 122 may not need an anti-stiction coating, but not limited thereto.

In addition, the MEMS package 100 includes a first cavity 112 directly above the first MEMS device 122 and a second cavity 114 directly above the second MEMS device 124. The first cavity 112 has a first pressure, and the second cavity 114 has a second pressure different from the first pressure since the first MEMS device 122 and the second MEMS device 124 require different cavity pressures. From a top-view, each of the first MEMS device 122 and the second MEMS device 124 may include a trench 123 located outside or inside the cavity thereof. Moreover, the MEMS package 100 includes a first bond seal ring 125A disposed corresponding to the first MEMS device 122 and a second bond seal ring 125B disposed corresponding to the second MEMS device 124. In some embodiments, a hole 140 is disposed in the second bond seal ring 125B to form a vent hole for pressure adjustment in the second cavity 114. The hole 140 is formed to laterally pass through the second bond seal ring 125B (such as along the Y-axis direction) and connected to the second cavity 114. In other embodiments, there may be multiple holes 140 disposed in the second bond seal ring 125B to form multiple vent holes for pressure adjustment in the second cavity 114. Each of the holes 140 is formed to laterally pass through the second bond seal ring 125B (such as along the X-axis or the Y-axis direction), and all the holes 140 are connected to the second cavity 114. In some embodiments, the width of each of the holes 140 in the X-axis or the Y-axis direction is between about 1 micrometer (μm) and about 100 μm. The length of each of the holes 140 in the Y-axis or the X-axis direction is substantially the same as the width of the second bond seal ring 125B.

Figure 2:
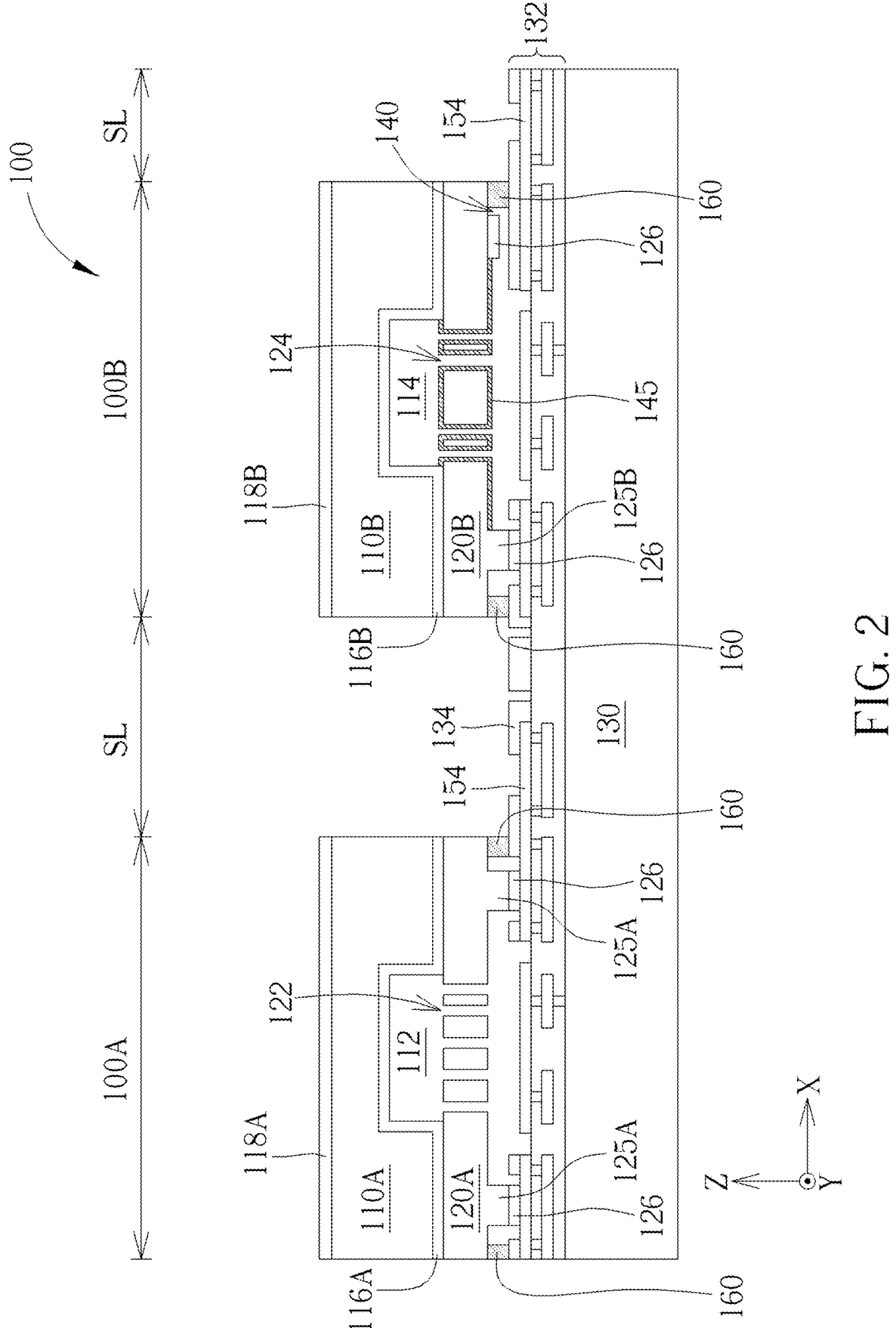
FIG. 2 is a schematic cross-sectional view of a MEMS package according to one embodiment of the present disclosure.

FIG. 2 is a schematic cross-sectional view of a MEMS package 100 according to one embodiment of the present disclosure. The MEMS package 100 includes a wafer 130 and an interconnect layer 132 formed on the wafer 130. The wafer 130 may include multiple complementary metal oxide semiconductor (CMOS) or other elements formed therein. The interconnect layer 132 includes several metal layers, several inter-metal dielectric (IMD) layers and several vias in the IMD layer to connect two metal layers. The bond pads 154 are disposed on the top metal layer of the interconnect layer 132, and a passivation layer 134 is disposed on the top metal layer of the interconnect layer 132 and has multiple openings to expose the bond pads 154, respectively. The MEMS package 100 includes a first device substrate 120A including the first MEMS device 122 and disposed on the wafer 130, and a second device substrate 120B including the second MEMS device 124 and also disposed on the wafer 130. The second device substrate 120B is laterally spaced apart from the first device substrate 120A. In order to make the figure simple and easy to understand, the MEMS structures of the first MEMS device 122 and the second MEMS device 124 are simplified in FIG. 2. The first bond seal ring 125A is disposed below the first device substrate 120A and bonded to the interconnect layer 132 through a bonding material 126. The second bond seal ring 125B is disposed below the second device substrate 120B and also bonded to the interconnect layer 132 through the bonding material 126. In some embodiments, the first bond seal ring 125A and the first device substrate 120A may be an integral structure and have the same composition such as silicon. The second bond seal ring 125B and the second device substrate 120B may also be an integral structure and have the same composition such as silicon. The composition of the bonding material 126 is, for example, germanium (Ge) for eutectic bonding with the top metal layer of the interconnect layer 132.

In addition, the MEMS package 100 includes a first handle substrate 110A bonded to the first device substrate 120A through a first bonding layer 116A, and a second handle substrate 110B bonded to the second device substrate 120B through a second bonding layer 116B. The first handle substrate 110A includes the first cavity 112 formed therein, and the first cavity 112 is disposed directly above the first MEMS device 122. The second handle substrate 110B includes the second cavity 114 formed therein, and the second cavity 114 is disposed directly above the second MEMS device 124. The first bonding layer 116A is disposed between the first device substrate 120A and the first handle substrate 110A. In some embodiments, the first bonding layer 116A may be further extended into the first cavity 112 to be conformally disposed on the sidewalls and the bottom surface of the first cavity 112. The second bonding layer 116B is disposed between the second device substrate 120B and the second handle substrate 110B. The second bonding layer 116B may be also extended into the second cavity 114 to be conformally disposed on the sidewalls and the bottom surface of the second cavity 114. Furthermore, a conductive layer 118A may be disposed on a top surface of the first handle substrate 110A. A conductive layer 118B may be disposed on a top surface of the second handle substrate 110B. The conductive layer 118A may be a patterned conductive layer electrically coupled to the first MEMS device 122 and/or the interconnect layer 132. The conductive layer 118B may be also a patterned conductive layer electrically coupled to the second MEMS device 124 and/or the interconnect layer 132.

In some embodiments, as shown in FIG. 2, the hole 140 is disposed to laterally pass through the second bond seal ring 125B along the X-axis direction and connected to the second cavity 114 through the trenches of the second MEMS device 124. Therefore, after the second device substrate 120B is bonded to the interconnect layer 132 on the wafer 130, the hole 140 is used as a vent hole for pressure adjustment in the second cavity 114 to achieve the required pressure for the second MEMS device 124. In some embodiments, in the Z-axis direction, the height of the vent hole/hole 140 may be the same as or slightly smaller than the thickness of the second bond seal ring 125B. The height of the vent hole/hole 140 may be about 1 μm to about 2 μm.

In some embodiments of the MEMS packages, the first cavity 112 has a first pressure P1, and the second cavity 114 has a second pressure P2 that is different from the first pressure P1 though the vent hole/hole 140 in the second bond seal ring 125B for pressure adjustment in the second cavity 114. The first pressure P1 in the first cavity 112 is controlled and determined during the process step of bonding the first device substrate 120A to the interconnect layer 132 on the wafer 130. The second pressure P2 in the second cavity 114 is adjusted to a desired vacuum level through the vent hole/hole 140 after the second device substrate 120B is bonded to the interconnect layer 132 on the wafer 130. In addition, an anti-stiction coating layer 145 may be conformally disposed on the second device substrate 120B to wrap around the second MEMS device 124 through the vent hole/hole 140 during the process step of adjusting pressure in the second cavity 114. After the second pressure P2 in the second cavity 114 is adjusted to the desired vacuum level and the anti-stiction coating layer 145 is formed on the second MEMS device 124, a dielectric film 160 is disposed on the interconnect layer 132 to reseal the vent hole/hole 140. A portion of the vent hole/hole 140 is filled with the dielectric film 160. In this embodiment, the top surface of the interconnect layer 132 provides a stage structure for depositing the dielectric film 160 to reseal the vent hole/hole 140. The dielectric film 160 may be formed on the passivation layer 134 and located adjacent to the first bond seal ring 125A and the second bond seal ring 125B. Since the height of the vent hole/hole 140 is small, for example about 1 μm to about 2 μm, the vent hole/hole 140 is easily resealed by depositing the dielectric film 160 on the interconnect layer 132. Moreover, in this embodiment, in the region of the hole 140, a portion of the bonding material 126 is formed on the back surface of the second device substrate 120B, and the dielectric film 160 is also located adjacent to the portion of the bonding material 126.

Figure 3:
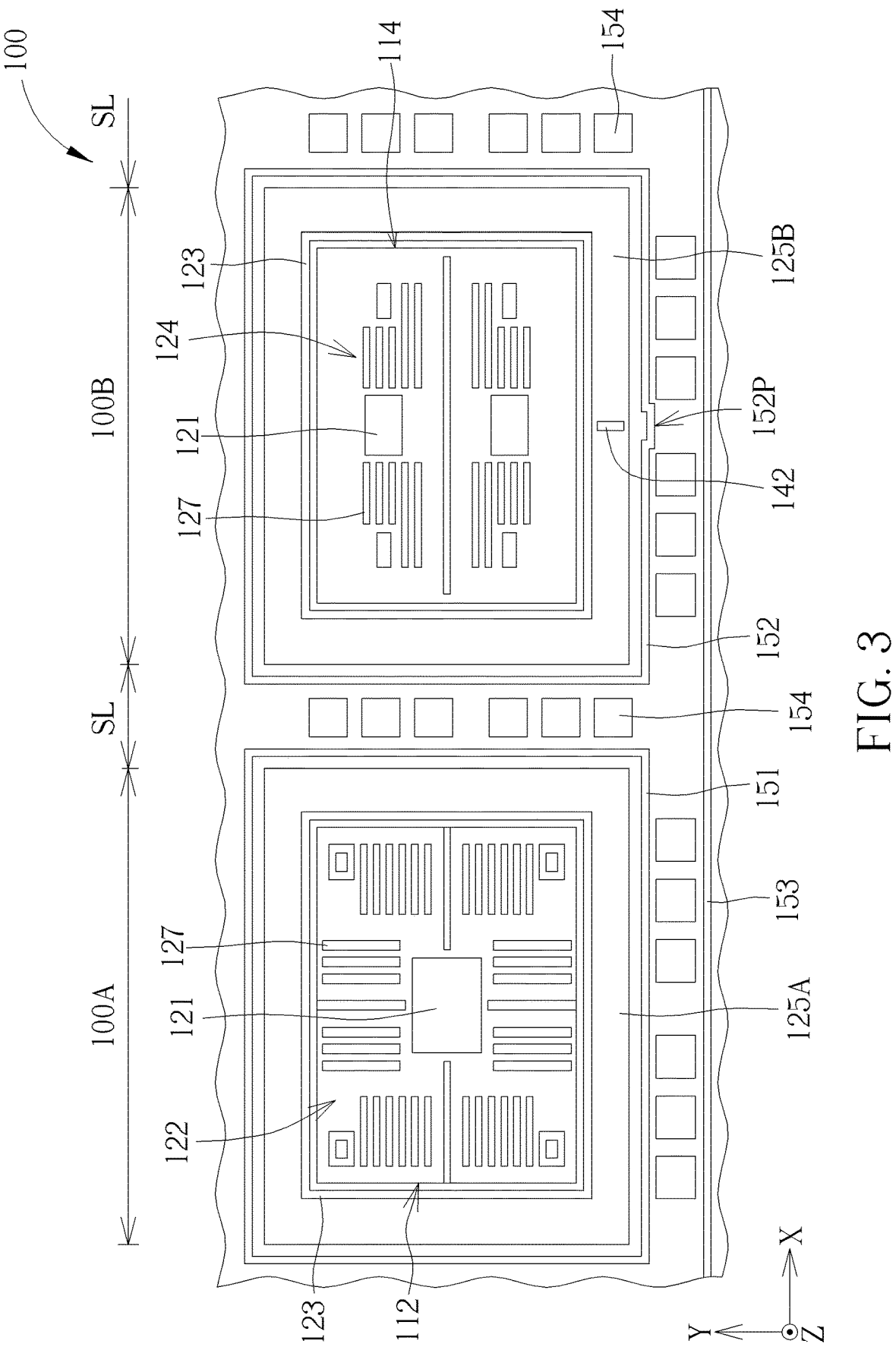
FIG. 3 is a schematic top view of a MEMS package according to another embodiment of the present disclosure.

FIG. 3 is a schematic top view of a MEMS package 100 according to another embodiment of the present disclosure. In the MEMS package 100 of FIG. 3, a hole 142 is disposed in the second bond seal ring 125B and vertically passes through the second bond seal ring 125B in the Z-axis direction. From the top-view, the hole 142 is surrounded by the second bond seal ring 125B without laterally passing through the second bond seal ring 125B in the Y-axis or X-axis direction. Moreover, in this embodiment, the pre-cut line 152 adjacent to the second bond seal ring 125B has a protruding portion (terrace structure) 152P corresponding to the location of the hole 142. The protruding portion 152P is protruded outwards away from the hole 142 to provide a stage structure outside a vent hole formed through the hole 142. In some embodiments, multiple holes 142 are formed in the second bond seal ring 125B, and the pre-cut line 152 has multiple protruding portions 152P corresponding to the holes 142. The details of other features of the MEMS package 100 of FIG. 3 may refer to the aforementioned descriptions of the MEMS package 100 of FIG. 1, and not repeated herein.

Figure 4:
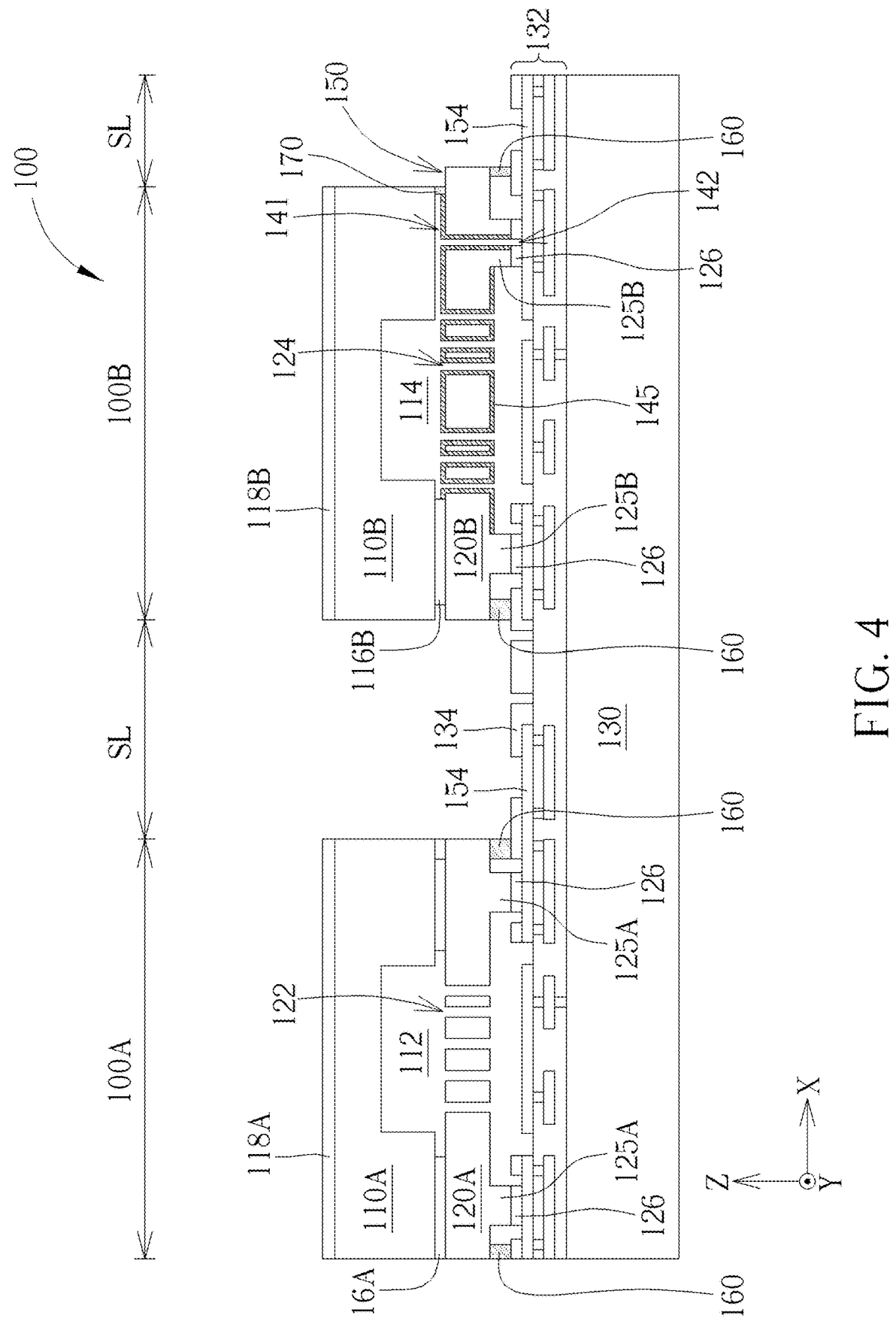
FIG. 4 is a schematic cross-sectional view of a MEMS package according to another embodiment of the present disclosure.

FIG. 4 is a schematic cross-sectional view of a MEMS package 100 according to another embodiment of the present disclosure. The MEMS package 100 includes the hole 142 disposed in the second bond seal ring 125B. The hole 142 vertically passes through the second bond seal ring 125B in the Z-axis direction and is further extended to pass through the second device substrate 120B. In this embodiment, a portion of the second bonding layer 116B between the second device substrate 120B and the second handle substrate 110B is removed by an etching process through the hole 142 to form a vent hole 141 in the second bonding layer 116B. As shown in FIG. 4, in some embodiments, the vent hole 141 is laterally extended along the X-axis direction between the second device substrate 120B and the second handle substrate 110B. Moreover, the vent hole 141 is connected to the second cavity 114 and the hole 142. The second pressure P2 in the second cavity 114 is adjusted to a desired vacuum level through the vent hole 141, so that the second pressure P2 in the second cavity 114 is different from the first pressure P1 in the first cavity 112.

Furthermore, in this embodiment, as shown in FIG. 3, the pre-cut line 152 adjacent to the second bond seal ring 125B has the protruding portion 152P. After a sawing process is performed on the scribe line SL, as shown in FIG. 4, the second device substrate 120B and the second handle substrate 110B construct a step structure 150 adjacent to the hole 142, and the vent hole 141 formed through the hole 142 is located in the step structure 150. Moreover, an anti-stiction coating layer 145 may be conformally disposed on the second device substrate 120B to wrap around the second MEMS device 124 through the vent hole 141 during the process step of adjusting the pressure in the second cavity 114. After the second pressure P2 in the second cavity 114 is adjusted to the desired vacuum level and the anti-stiction coating layer 145 is formed on the second MEMS device 124 through the vent hole 141, a sealing layer 170 is deposited on the stage of the step structure 150 to reseal the vent hole 141. A portion of the vent hole 141 is filled with the sealing layer 170. In addition, a dielectric film 160 is formed on the passivation layer 134 of the interconnect layer 132 and located adjacent to the first bond seal ring 125A and the second bond seal ring 125B. In some embodiments, the sealing layer 170 and the dielectric film 160 may be formed by the same deposition process and have the same composition, for example, silicon oxide.

In some embodiments, as shown in FIG. 4, the first bonding layer 116A is disposed between the first device substrate 120A and the first handle substrate 110A, and not extended onto the sidewalls and the bottom surface of the first cavity 112. The second bonding layer 116B is also disposed between the second device substrate 120B and the second handle substrate 110B, and not extended onto the sidewalls and the bottom surface of the second cavity 114. A portion of the second bonding layer 116B corresponding to the hole 142 is removed to form the vent hole 141. In some embodiments, in the Z-axis direction, the height of the vent hole 141 may be the same as or slightly smaller than the thickness of the second bonding layer 116B. For example, the height of the vent hole 141 may be about 1000 Å to about 2000 Å. In some embodiments, the width of the vet hole 141 in the Y-axis direction may be in a range of about 1 μm to about 100 μm. The length of the vet hole 141 in the X-axis direction is the same as the width of the second bonding layer 116B. The details of other features of the MEMS package 100 of FIG. 4 may refer to the aforementioned descriptions of the MEMS package 100 of FIG. 2, and not repeated herein.

Figure 5:
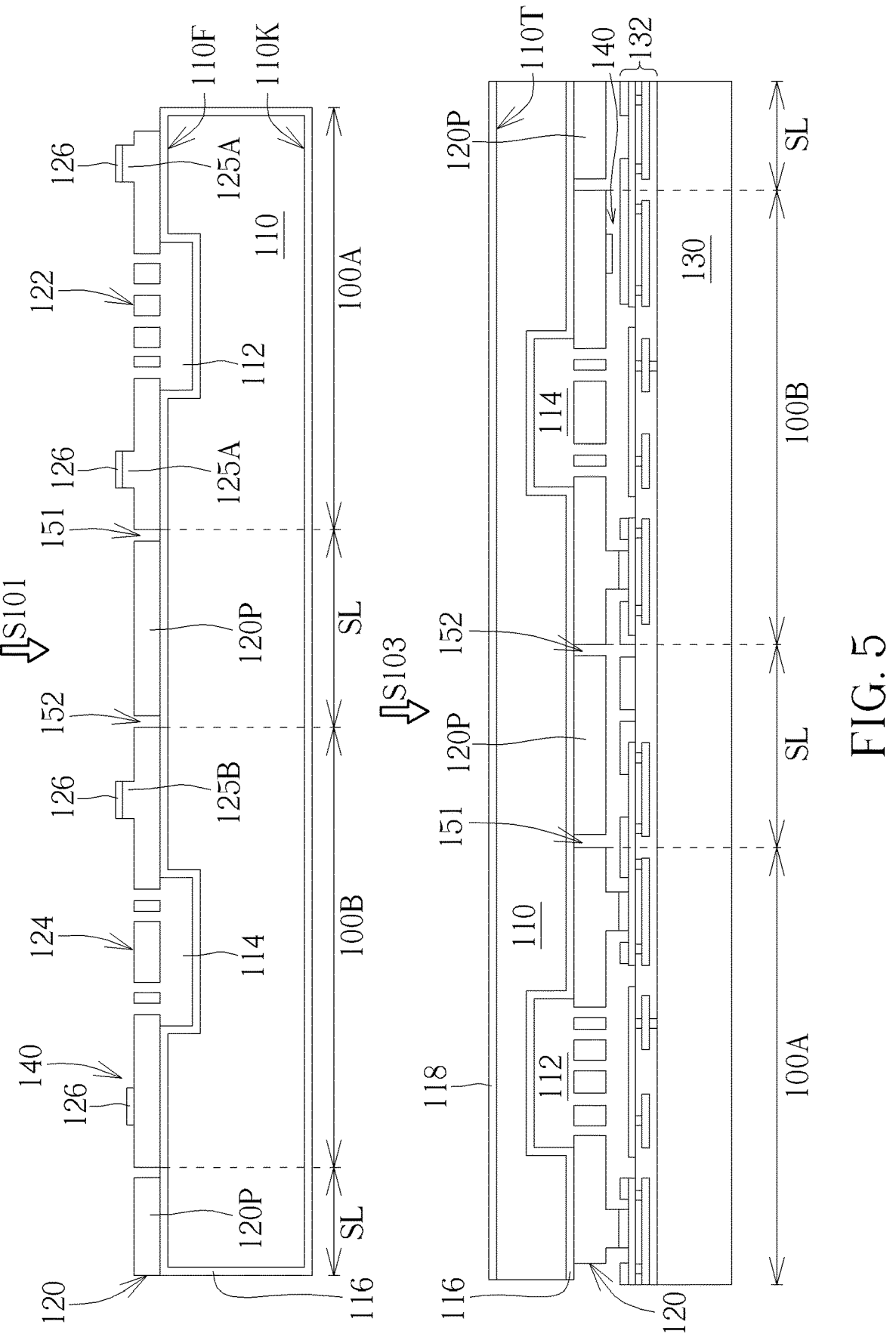
FIG. 5, FIG. 6 and FIG. 7 are schematic cross-sectional views of some intermediate stages of a method of fabricating a MEMS package according to one embodiment of the present disclosure.
Figure 6:
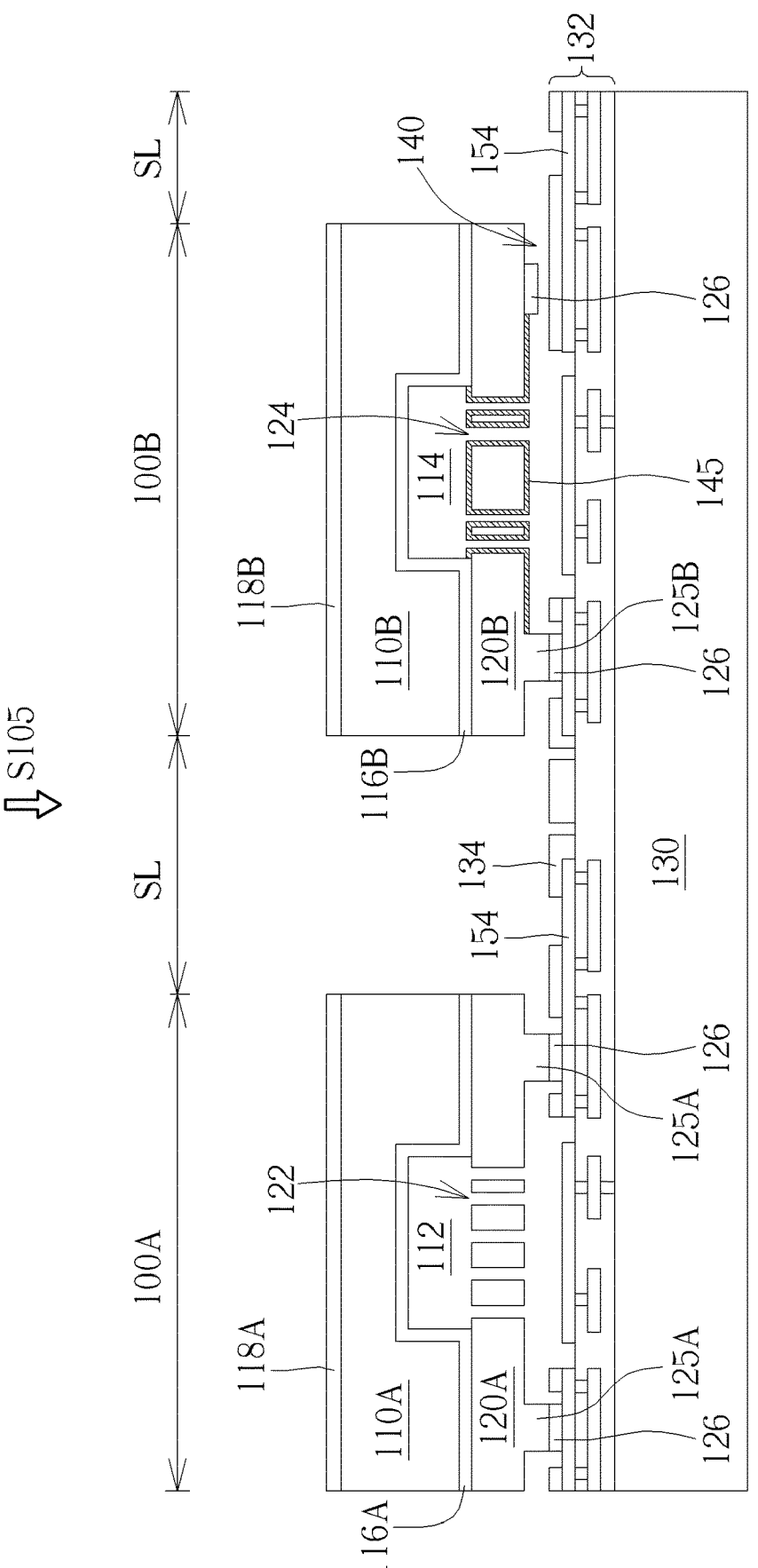
Figure 7:
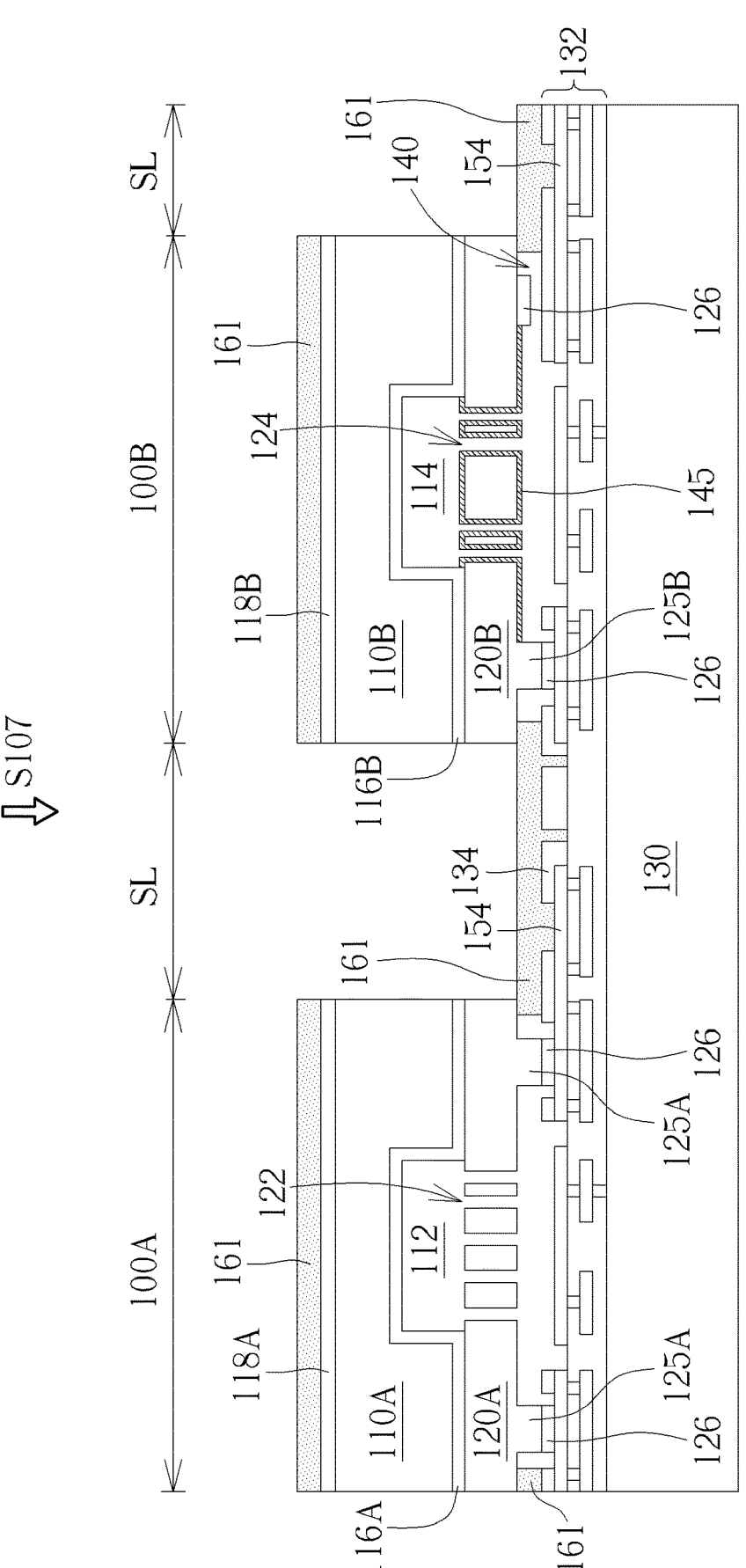

FIG. 5, FIG. 6 and FIG. 7 are schematic cross-sectional views of some intermediate stages of a method of fabricating a MEMS package according to one embodiment of the present disclosure. Referring to FIG. 5, in step S101, firstly, a handle wafer 110 such as a silicon wafer is provided. A first cavity 112 and a second cavity 114 are formed by an etching process performed on a surface 110F of the handle wafer 110. Then, a bonding layer 116 is conformally deposited on the handle wafer 110 and in the first cavity 112 and the second cavity 114 to wrap around the handle wafer 110. The composition of the bonding layer 116 is, for example, silicon oxide. The bonding layer 116 may be formed by a thermal oxidation or a deposition process. In addition, a device wafer 120 such as a silicon wafer is provided and bonded on the surface 110F of the handle wafer 110 to cover the first cavity 112 and the second cavity 114. The device wafer 120 is patterned by photolithography and etching processes to form the first MEMS device 122 and the second MEMS device 124 laterally spaced apart from each other. The device wafer 120 includes the first device substrate 120A with the first MEMS device 122, the second device substrate 120B with the second MEMS device 124, and a portion 120P of the device wafer 120 between the first device substrate 120A and the second device substrate 120B. A pre-cut line 151 is formed in the device wafer 120 between the first device substrate 120A and the portion 120P. Another pre-cut line 152 is formed in the device wafer 120 between the second device substrate 120B and the portion 120P. The two pre-cut lines 151 and 152 are formed between the first MEMS device 122 and the second MEMS device 124. The pre-cut lines 151 and 152 and the trenches of the first MEMS device 122 and the second MEMS device 124 may be formed simultaneously by the same etching process such as a deep reactive-ion etching (DRIE) process.

In addition, the first bond seal ring 125A and the second bond seal ring 125B are formed corresponding to the first MEMS device 122 and the second MEMS device 124, respectively. The first bond seal ring 125A and the first device substrate 120A may be an integral structure formed from the device wafer 120. The second bond seal ring 125B and the second device substrate 120B may also be an integral structure formed from the device wafer 120. The first bond seal ring 125A and the second bond seal ring 125B may be formed by patterning the device wafer 120. In this embodiment, a hole 140 as shown in FIG. 1 is formed in the second bond seal ring 125B by an etching process to laterally pass through the second bond seal ring 125B. Then, a bonding material 126 such as Ge is formed on the first bond seal ring 125A and the second bond seal ring 125B. In the region of the hole 140, the bonding material 126 is formed on the second device substrate 120B.

Still referring to FIG. 5, in step S103, the handle wafer 110 and the device wafer 120 are turned upside down, where the first cavity 112 is directly above the first MEMS device 122 and the second cavity 114 is directly above the second MEMS device 124. A wafer 130 such as a CMOS wafer with the interconnect layer 132 formed thereon is provided. Then, the device wafer 120 is bonded to the interconnect layer 132 on the wafer 130 through the bonding material 126 at a first pressure P1. In the step S103, both the first cavity 112 and the second cavity 114 have the first pressure P1. In addition, the handle wafer 110 is thinned by a grinding or an etching process performed on another surface 110K of the handle wafer 110. Then, a conductive layer 118 such as an aluminum (Al) layer is deposited on a top surface 110T of the thinned handle wafer 110.

Next, referring to FIG. 6, in step S105, a portion of the handle wafer 110 and the portion 120P of the device wafer 120 between the two pre-cut lines 151 and 152 at the scribe line SL are removed by a sawing process to expose the hole 140 at an ambient pressure. The bond pads 154 at the scribe line SL are also exposed by the sawing process. In the step S105, the first cavity 112 directly above the first MEMS device 122 is maintained at the first pressure P1 of the step S103. The hole 140 in the second bond seal ring 125B is exposed and used as a vent hole for pressure adjustment in the second cavity 114, so that the pressure in the second cavity 114 is adjusted to be a second pressure P2 different from the first pressure P1 in the first cavity 112. Furthermore, in some embodiments, an anti-stiction coating layer 145 is conformally deposited on the second device substrate 120B through the vent hole/hole 140 to wrap around the second MEMS device 124 during the process step of adjusting pressure in the second cavity 114. In some embodiments, the anti-stiction coating layer 145 is a self-assembled monolayer (SAM) coating formed by a vapor deposition process. The composition of the anti-stiction coating layer 145 may be an organic material, for example 1H,1H,2H,2H-perfluorodecyltrichlorosilane (FDTS), octadecyltrichlorosilane (OTS) or dichlorodimethylsilane (DDMS).

Afterwards, referring to FIG. 7, in step S107, a dielectric material layer 161 is deposited on the interconnect layer 132 to reseal the vent hole/hole 140 at the second pressure P2 by a blanket deposition process such as a chemical vapor deposition (CVD), physical vapor deposition (PVD) or atomic layer deposition (ALD) process. The dielectric material layer 161 is also deposited on the conductive layers 118A and 118B. The composition of the dielectric material layer 161 may be silicon oxide. Then, the portions of the dielectric material layer 161 on the conductive layers 118A and 118B are removed by an etching process to expose the conductive layers 118A and 118B. Another portion of the dielectric material layer 161 on the interconnect layer 132 is also removed by the etching process to form the dielectric film 160, thereby exposing the bond pads 154 at the scribe line SL. A portion of the vent hole/hole 140 is filled with the dielectric film 160 to complete the MEMS package 100 of FIG. 2.

Figure 8:
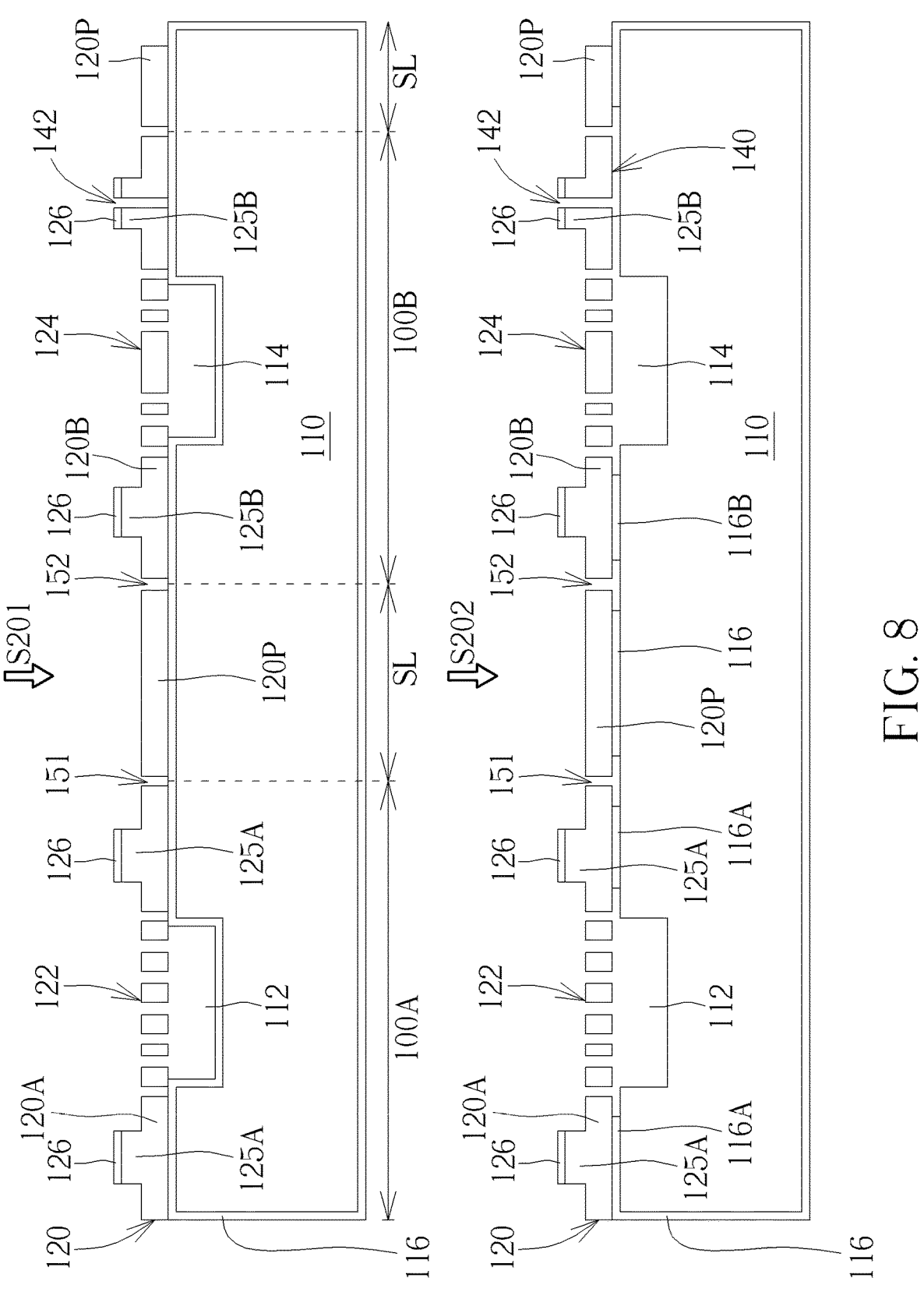
FIG. 8, FIG. 9 and FIG. 10 are schematic cross-sectional views of some intermediate stages of a method of fabricating a MEMS package according to another embodiment of the present disclosure.
Figure 9:
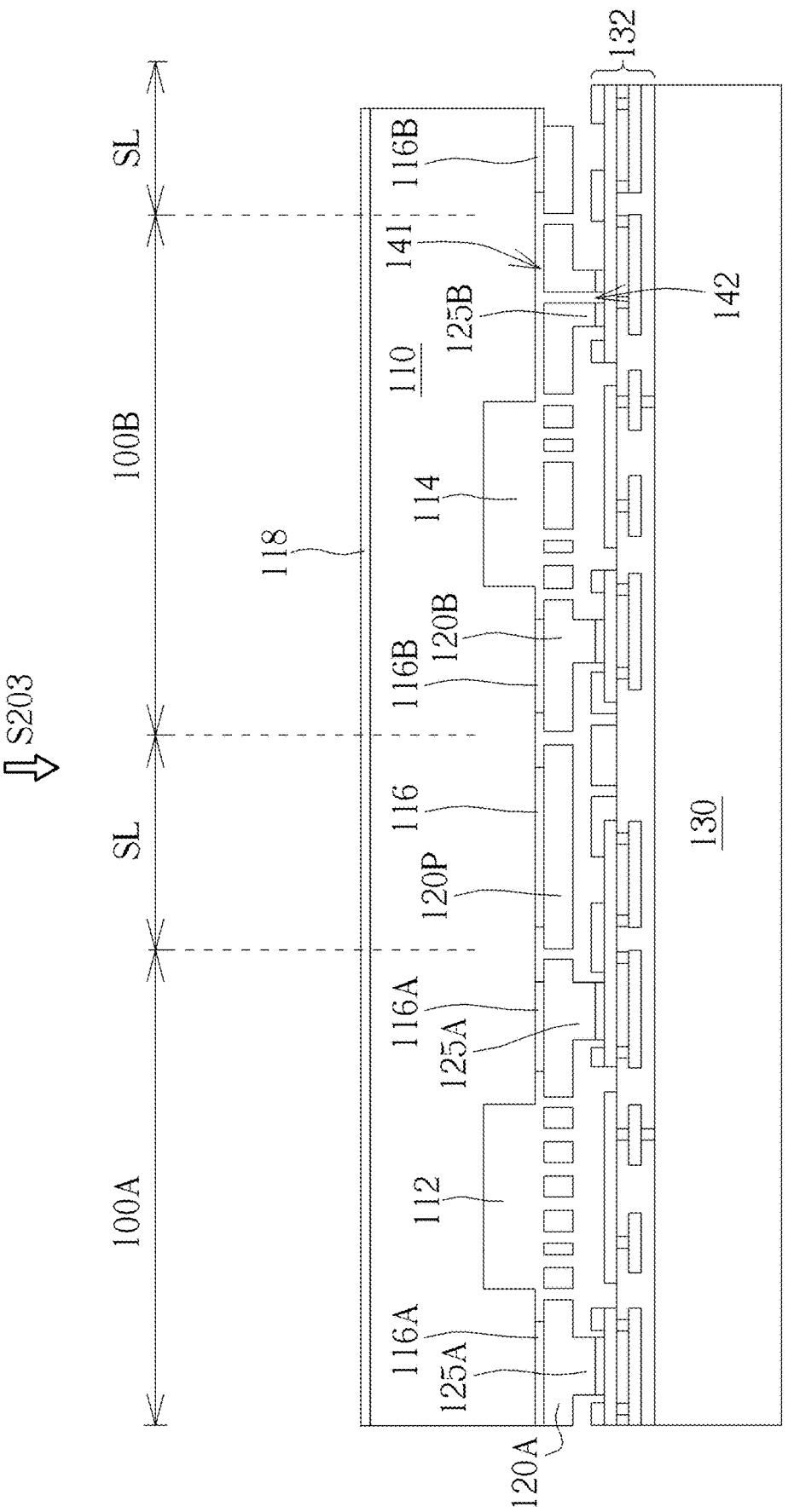
Figure 10:
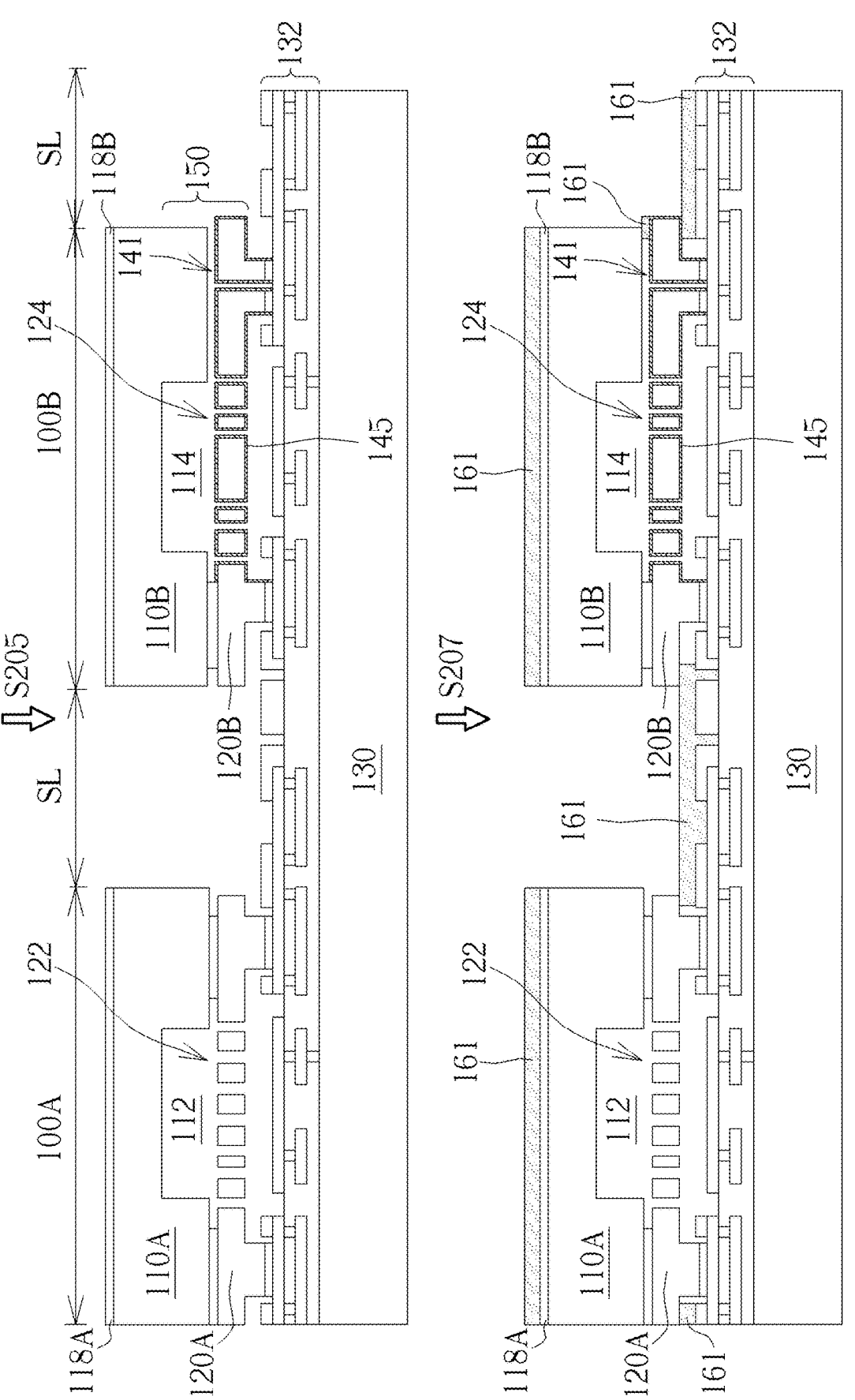

FIG. 8, FIG. 9 and FIG. 10 are schematic cross-sectional diagrams of some intermediate stages of a method of fabricating a MEMS package 100 according to another embodiment of the present disclosure. Referring to FIG. 8, in step S201, firstly, a handle wafer 110 is provided. The first cavity 112 and the second cavity 114 are formed in the handle wafer 110. Then, a bonding layer 116 is conformally deposited on the handle wafer 110 and in the first cavity 112 and the second cavity 114 to wrap around the handle wafer 110. A device wafer 120 is provided and bonded with the handle wafer 110 to cover the first cavity 112 and the second cavity 114. The device wafer 120 includes a first device substrate 120A with the first MEMS device 122, a second device substrate 120B with the second MEMS device 124, a first bond seal ring 125A corresponding to the first MEMS device 122, a second bond seal ring 125B corresponding to the second MEMS device 124, and a portion 120P of the device wafer 120 between two pre-cut lines 151 and 152. Moreover, a bonding material 126 is formed on both the first bond seal ring 125A and the second bond seal ring 125B.

In this embodiment, in the step S201, a hole 142 as shown in FIG. 3 is formed to vertically pass through the bonding material 126 and the second bond seal ring 125B, and is further extended to vertically pass through the second device substrate 120B to expose a portion of the bonding layer 116. The pre-cut lines 151 and 152, the trenches of the first MEMS device 122 and the second MEMS device 124, and the hole 142 may be formed simultaneously by the same etching process such as a DRIE process. The other details of the step S201 may refer to the aforementioned descriptions of the step S101 in FIG. 5, and not repeated herein.

Still referring to FIG. 8, in step S202, some portions of the bonding layer 116 in both the first cavity 112 and the second cavity 114 and between the device wafer 120 and the handle wafer 110 are removed by an etching process using vapor hydrofluoric acid (VHF) through the trenches of the first MEMS device 122 and the second MEMS device 124 and the pre-cut lines 151 and 152. Moreover, a portion of the bonding layer 116 between the second device substrate 120B and the handle wafer 110 is also removed by the etching process using VHF through the hole 142 to form a vent hole 141 that is connected to the second cavity 114 and the hole 142.

Next, referring to FIG. 9, in step S203, the handle wafer 110 and the device wafer 120 are turned upside down, where the first cavity 112 is directly above the first MEMS device 122, and the second cavity 114 is directly above the second MEMS device 124. Then, a wafer 130 with the interconnect layer 132 formed thereon is provided. The device wafer 120 is bonded to the interconnect layer 132 on the wafer 130 through the bonding material 126 at a first pressure P1. In the step S203, both the first cavity 112 and the second cavity 114 have the first pressure P1. The vent hole 141 is formed in the second bonding layer 116B and used for pressure adjustment in the second cavity 114 in the subsequent process. The other details of the step S203 may refer to the aforementioned descriptions of the step S103 of FIG. 5 and not repeated herein.

Next, referring to FIG. 10, in step S205, a portion of the handle wafer 110 and the portion 120P of the device wafer 120 between the two pre-cut lines 151 and 152 at the scribe line SL are removed by a sawing process to expose the vent hole 141 at an ambient pressure. The hole 142 in both the second bond seal ring 125B and the second device substrate 120B and the second cavity 114 are also exposed at the ambient pressure. Moreover, in the step S205, the first cavity 112 directly above the first MEMS device 122 is maintained at the first pressure P1 of the step S203. The vent hole 141 is used for adjusting the pressure in the second cavity 114 to be a desired vacuum level, so that the second cavity 114 has a second pressure P2 that is different from the first pressure P1 in the first cavity 112. Furthermore, in some embodiments, an anti-stiction coating layer 145 is conformally deposited on the second device substrate 120B to wrap around the second MEMS device 124 through the vent hole 141 during the step S205. The other details of the step S205 may refer to the aforementioned descriptions of the step S105 of FIG. 6 and not repeated herein.

Moreover, in this embodiment, since the pre-cut line 152 has the protruding portion 152P corresponding to the location of the hole 142 as shown in FIG. 3, after the sawing process of the step S205, the second handle substrate 110B and the second device substrate 120B construct a step structure 150 as shown in the cross-sectional view of FIG. 10. The vent hole 141 is located in the step structure 150.

Next, still referring to FIG. 10, in step S207, a dielectric material layer 161 is deposited on the stage of the step structure 150 to reseal the vent hole 141 at the second pressure P2. In addition, the dielectric material layer 161 is also deposited on the interconnect layer 132 around both the first bond seal ring 125A and the second bond seal ring 125B and on the conductive layers 118A and 118B. In some embodiments, the dielectric material layer 161 may be formed by a blanket deposition process such as a CVD, PVD or ALD process, and has the composition such as silicon oxide. Then, a portion of the dielectric material layer 161 on the conductive layers 118A and 118B is removed by an etching process to expose the conductive layers 118A and 118B. Another portion of the dielectric material layer 161 on the interconnect layer 132 is also removed by the etching process to form the dielectric film 160, thereby exposing the bond pads 154 at the scribe line SL. In addition, a portion of the dielectric material layer 161 on the stage of the step structure 150 is also removed by the etching process to form the sealing layer 170, and the vent hole 141 is filled with the sealing layer 170 to complete the MEMS package 100 of FIG. 4.

According to the embodiments of the present disclosure, the MEMS package includes various MEMS devices packaged at different pressures. In some embodiments, the MEMS package may include an inertial measurement unit (IMU) that includes the first MEMS device such as a gyroscope and the second MEMS device such as an accelerometer. The first and second MEMS devices require different vacuum levels and different anti-stiction requirements, and are integrated on one chip. In one embodiment, one or multiple vent holes may be disposed to laterally pass through the second bond seal ring, and connected to the second cavity for pressure adjustment. The height of these vent holes is substantially the same as the thickness of the second bond seal ring. In another embodiment, one or multiple vent holes may be formed in the second bonding layer between the second device substrate and the second handle substrate, and connected to the second cavity for pressure adjustment. The height of these vent holes is substantially the same as the thickness of the second bonding layer. The second pressure in the second cavity may be adjusted to be different from the first pressure in the first cavity through the vent hole after the device wafer is bonded with the handle wafer and the CMOS wafer.

In addition, an anti-stiction coating layer may be formed on the second MEMS device through the vent hole during the process step of adjusting the pressure in the second cavity. Moreover, the MEMS package includes a stage structure outside the vent hole, so that the vent hole with the small height is easily resealed by depositing the dielectric film on the stage structure, thereby improving the reliability of sealing the vent hole. Therefore, the MEMS packages of the present disclosure enable post bonding pressure adjustment in different cavities and post bonding anti-stiction coating on different MEMS devices. The whole packaging process of the MEMS package including various MEMS devices with different cavity pressures is simplified and the footprint of the MEMS package is small.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A micro-electro-mechanical system (MEMS) package, comprising:
   a wafer;
   an interconnect layer, disposed on the wafer;
   a first device substrate comprising a first MEMS device and disposed on the wafer;
   a second device substrate comprising a second MEMS device, laterally spaced apart from the first device substrate and disposed on the wafer;
   a first bond seal ring, disposed below the first device substrate and bonded to the interconnect layer;
   a second bond seal ring, disposed below the second device substrate and bonded to the interconnect layer;
   a first handle substrate, including a first cavity and bonded to the first device substrate;
   a second handle substrate, including a second cavity and bonded to the second device substrate;
   a hole, disposed in the second bond seal ring and vertically passing through the second bond seal ring; and
   a dielectric film, disposed on the interconnect layer and adjacent to the first bond seal ring and the second bond seal ring,
   wherein the first cavity has a first pressure, and the second cavity has a second pressure different from the first pressure.

2. The MEMS package of claim 1, wherein the hole further laterally passes through the second bond seal ring and is connected to the second cavity, and a portion of the hole is filled with the dielectric film.

3. The MEMS package of claim 1, wherein a height of the hole is the same as a thickness of the second bond seal ring, and a width of the hole is between 1 micrometer (μm) and 100 μm.

4. The MEMS package of claim 1, wherein the first MEMS device comprises a gyroscope, the second MEMS device comprises an accelerometer, and the second pressure is greater than the first pressure.

5. The MEMS package of claim 1, further comprising an anti-stiction coating layer conformally disposed on the second device substrate.

6. The MEMS package of claim 1, further comprising a first bonding layer disposed between the first device substrate and the first handle substrate, and a second bonding layer disposed between the second device substrate and the second handle substrate.

7. The MEMS package of claim 6, wherein the hole is extended to further vertically pass through the second device substrate.

8. The MEMS package of claim 7, further comprising a vent hole disposed in the second bonding layer, laterally extended between the second device substrate and the second handle substrate, and connected to the second cavity and the hole.

9. The MEMS package of claim 8, wherein the second device substrate and the second handle substrate construct a step structure and the vent hole is located in the step structure.

10. The MEMS package of claim 9, further comprising a sealing layer filled in a portion of the vent hole and on the step structure, wherein the sealing layer is in direct contact with the second device substrate.

11. The MEMS package of claim 1, wherein the dielectric film is in direct contact with a bottom surface of the second device substrate and a top surface of the interconnect layer.

* * * * *